United States Patent
Wang

(10) Patent No.: US 11,304,134 B2
(45) Date of Patent: Apr. 12, 2022

(54) RADIO FREQUENCY SYSTEM BASED ON MILLIMETER WAVE COMMUNICATION, METHOD FOR ADJUSTING TRANSMIT POWER, AND TERMINAL

(71) Applicant: VIVO MOBILE COMMUNICATION CO., LTD., Chang'an Dongguan (CN)

(72) Inventor: Kun Wang, Chang'an Dongguan (CN)

(73) Assignee: VIVO MOBILE COMMUNICATION CO., LTD., Guangdong (CN)

( * ) Notice: Subject to any disclaimer, the term of this patent is extended or adjusted under 35 U.S.C. 154(b) by 0 days.

(21) Appl. No.: 17/038,798

(22) Filed: Sep. 30, 2020

(65) Prior Publication Data
US 2021/0029633 A1    Jan. 28, 2021

Related U.S. Application Data

(63) Continuation of application No. PCT/CN2019/080087, filed on Mar. 28, 2019.

(30) Foreign Application Priority Data

Mar. 30, 2018    (CN) .......................... 201810275703.3

(51) Int. Cl.
*H04W 52/02*    (2009.01)
*H03F 3/24*    (2006.01)
(Continued)

(52) U.S. Cl.
CPC ...... *H04W 52/0209* (2013.01); *H03F 1/0288* (2013.01); *H03F 3/245* (2013.01);
(Continued)

(58) Field of Classification Search
CPC ........... H04W 52/0209; H04W 52/146; H04W 52/42; H03F 1/0288; H03F 3/245; H03F 2200/451
(Continued)

(56) References Cited

U.S. PATENT DOCUMENTS 6,453,177 B1 * 9/2002 Wong .................. H01Q 1/246
455/450
2009/0115530 A1    5/2009 Bott
(Continued)

FOREIGN PATENT DOCUMENTS

CN    1442001 A    9/2003
CN    101582682 A    11/2009
(Continued)

OTHER PUBLICATIONS

Extended European Search Report for related Application No. 19775848.5; dated Mar. 30, 2021.
(Continued)

*Primary Examiner* — Lee Nguyen
(74) *Attorney, Agent, or Firm* — von Briesen & Roper, s.c.

(57) ABSTRACT

A radio frequency system based on millimeter wave communication, a method for adjusting transmit power, and a terminal are provided. The radio frequency system includes a Doherty power amplification unit, an antenna array, and a micro control unit MCU, where an output end of the Doherty power amplification unit is connected to an input end of the antenna array, a control end of the Doherty power amplification unit and a control end of the antenna array are both connected to the MCU, and the MCU controls a radiation direction of an antenna in the antenna array; and the Doherty power amplification unit includes two power amplifiers, saturation power of the two power amplifiers is equal, a switch controller is connected in series to one of the two power amplifiers, and the MCU controls transmit power of the Doherty power amplification unit by controlling opening and closing of the switch controller.

10 Claims, 5 Drawing Sheets

(51) Int. Cl.
*H03F 1/02* (2006.01)
*H04W 52/14* (2009.01)
*H04W 52/42* (2009.01)

(52) U.S. Cl.
CPC ......... *H04W 52/146* (2013.01); *H04W 52/42* (2013.01); *H03F 2200/451* (2013.01)

(58) Field of Classification Search
USPC ........................................................ 455/522
See application file for complete search history.

(56) References Cited

U.S. PATENT DOCUMENTS

| | | |
|---|---|---|
| 2010/0001802 A1 | 1/2010 | Blednov |
| 2012/0075018 A1 | 3/2012 | Gong et al. |
| 2014/0035676 A1 | 2/2014 | Huazhang et al. |
| 2019/0165738 A1* | 5/2019 | Pan ................... H03F 1/0288 |
| 2021/0029633 A1 | 1/2021 | Wang |

FOREIGN PATENT DOCUMENTS

| | | |
|---|---|---|
| CN | 102324613 A | 1/2012 |
| CN | 102761310 A | 10/2012 |
| CN | 103944623 A | 7/2014 |
| CN | 104333332 A | 2/2015 |
| CN | 107222173 A | 9/2017 |
| CN | 107395131 A | 11/2017 |
| CN | 108616975 A | 10/2018 |
| EP | 2541759 A1 | 1/2013 |
| EP | 3281032 A1 | 2/2018 |
| WO | 2016163925 A1 | 10/2016 |
| WO | 2018004402 A1 | 1/2018 |

OTHER PUBLICATIONS

Chaoyi Huang, et al., "A 80W High Gain and Broadband Doherty Power Amplifier for 4/5G Wireless Communication Systems", School of Electronic Engineering, University of Electronic Science and Technology of China, Chengdu, China, 2016, IEEE.

International Search Report & Written Opinion related to Application No. PCT/CN2019/080087; dated Oct. 15, 2020.

Chinese Office Action for related Chinese Application No. 201810275703.3; dated Jul. 30, 2019.

Chang-Jiang You, et al., "Design of Inverted Doherty Power Amplifier with Class-E Peaking Amplifier", Dec. 2010, vol. 26 No. 6, Journal of Microwaves, State Key Lab of MillimeterWaves, Southeast University, Nanjing, China.

Wenhua Chen, et al., "Energy-Efficient Doherty Power Amplifier MMIC and Beamforming-Oriented Digital Predistortion for 5G Massive MIMO Application", Nov. 13, 2017, pp. 391-394, Proceedings of 2017 Asia Pacific Microwave Conference, Dept. of Electronic Engineering, Tsinghua University, Beijing, P.R. China.

* cited by examiner

RADIO FREQUENCY SYSTEM BASED ON MILLIMETER WAVE COMMUNICATION, METHOD FOR ADJUSTING TRANSMIT POWER, AND TERMINAL

CROSS REFERENCE TO RELATED APPLICATIONS

This patent application is a bypass continuation under 35 U.S.C. § 111 of PCT Application No. PCT/CN2019/080087 filed on Mar. 28, 2019, which claims priority to Chinese Patent Application No. 201810275703.3, filed in China on Mar. 30, 2018, which is incorporated herein by reference in its entirety.

TECHNICAL FIELD

This disclosure relates to the field of communications technologies, and in particular, to a radio frequency system based on millimeter wave communication, a method for adjusting transmit power, and a terminal.

BACKGROUND

Currently, in 3G and 4G networks, to improve transmission efficiency of a radio frequency system of a terminal device and prolong standby time of the terminal device, an uplink signal having a low peak to average power ratio (Peak to Average Power Ratio, PAPR) is generally used. Therefore, a plurality of technologies for generating an uplink signal having a low peak to average power ratio are developed. For example, in the 3G and 4G networks, most uplink signals are generated by using a single-carrier frequency division multiple access (Single-carrier Frequency Division Multiple Access, SC-FDMA) technology.

However, in a 5G or higher-end communications network, to improve signal processing efficiency, an uplink (Uplink, UL) modulation scheme corresponding to an uplink signal of the network generally uses an orthogonal frequency division multiplexing (Orthogonal Frequency Division Multiplexing, OFDM) technology. An uplink signal generated by using the orthogonal frequency division multiplexing technology has a high peak to average power ratio. The peak to average power ratio of the uplink signal may be as high as 8 dB to 12 dB. The peak to average power ratio of the uplink signal is at least 3 dB higher than a peak to average power ratio of an uplink signal in a 4G network. Moreover, in the 5G or higher-end communications network, to satisfy coverage, maximum transmit power of a power amplifier of a terminal device needs to be increased correspondingly. Therefore, power consumption of the terminal device naturally increases greatly, and standby time is apparently reduced. In addition, to maintain transmit signal quality, the power amplifier of the terminal device needs to work in a power backoff state, but power backoff causes efficiency reduction. Therefore, efficiency of the power amplifier needs to be improved as much as possible, while signal quality is ensured. How to improve transmission efficiency of a terminal device while controlling power consumption of the terminal device has become a key technology of a wireless communications network.

SUMMARY

Embodiments of this disclosure provide a radio frequency system based on millimeter wave communication, a method for adjusting transmit power, and a terminal, to resolve a problem in the related art that efficiency of a power amplifier needs to be improved as much as possible while signal quality is ensured and power consumption of a terminal device is controlled.

To resolve the foregoing technical problem, the embodiments of this disclosure are implemented as follows:

According to a first aspect, an embodiment of this disclosure provides a radio frequency system based on millimeter wave communication, where the radio frequency system includes a Doherty power amplification unit, an antenna array, and a micro control unit MCU, where an output end of the Doherty power amplification unit is connected to an input end of the antenna array, a control end of the Doherty power amplification unit and a control end of the antenna array are both connected to the MCU, and the MCU controls a radiation direction of an antenna in the antenna array; and the Doherty power amplification unit includes two power amplifiers, saturation power of the two power amplifiers is equal, a switch controller is connected in series to one of the two power amplifiers, and the MCU controls transmit power of the Doherty power amplification unit by controlling opening and closing of the switch controller.

According to a second aspect, an embodiment of this disclosure provides a mobile terminal, including the radio frequency system based on millimeter wave communication in the first aspect.

According to a third aspect, an embodiment of this disclosure provides a method for adjusting transmit power, where the method is applied to the mobile terminal provided in the second aspect, and the method includes:

determining, based on a downlink signal from a network-side device, level information corresponding to the downlink signal;

adjusting, based on the level information, a direction of an antenna array in the radio frequency system based on millimeter wave communication in the mobile terminal; and after the direction of the antenna array is adjusted, if a level value corresponding to a downlink signal received from the network-side device increases, controlling the Doherty power amplification unit in the radio frequency system to reduce transmit power by using the MCU in the radio frequency system.

According to a fourth aspect, an embodiment of this disclosure provides a computer-readable storage medium, where the computer-readable storage medium stores a computer program, and when the computer program is executed by a processor, steps of the method for adjusting transmit power according to the third aspect are implemented.

As can be seen from the technical solutions provided in the embodiments of this disclosure, the radio frequency system provided in the embodiments of this disclosure includes a Doherty power amplification unit, an antenna array, and a micro control unit MCU, where an output end of the Doherty power amplification unit is connected to an input end of the antenna array, a control end of the Doherty power amplification unit and a control end of the antenna array are both connected to the MCU, and the MCU controls a radiation direction of an antenna in the antenna array; and the Doherty power amplification unit includes two power amplifiers, saturation power of the two power amplifiers is equal, a switch controller is connected in series to one of the two power amplifiers, and the MCU controls transmit power of the Doherty power amplification unit by controlling opening and closing of the switch controller in the Doherty power amplification unit. Therefore, based on the structure of the radio frequency system, transmit power of the Doherty power amplification unit can be controlled by controlling opening and closing of the switch controller in the Doherty power amplification unit. Efficiency of the power amplifier is improved as much as possible while signal quality is ensured. In addition, standby time of the mobile terminal can be increased by controlling transmit power of the Doherty power amplification unit and further controlling transmit power consumption of the radio frequency system.

BRIEF DESCRIPTION OF DRAWINGS

To describe the technical solutions in the embodiments of this disclosure more clearly, the following briefly describes the accompanying drawings required for describing the embodiments. Apparently, the accompanying drawings in the following description show merely some embodiments described in this disclosure, and a person of ordinary skill in the art may still derive other drawings from these accompanying drawings without creative efforts.

DESCRIPTION OF LEGENDS

100: Doherty power amplification unit; 101: one-to-two power splitter; 102: switch controller; Vcc1: first power supply; Vcc2: second power supply; Z01 to Z03: first ¼ wavelength impedance line to third ¼ wavelength impedance line; 103: primary amplifier; 104: peak amplifier; 200: antenna array; 201: antenna array element; 300: micro control unit MCU; and 400: network-side device.

DESCRIPTION OF EMBODIMENTS

Embodiments of this disclosure provide a radio frequency system based on millimeter wave communication, a method for adjusting transmit power, and a terminal.

To help a person skilled in the art better understand the technical solutions of this disclosure, the technical solutions in the embodiments of this disclosure are hereinafter described clearly with reference to the accompanying drawings in the embodiments of this disclosure. Evidently, the described embodiments are only some embodiments of this disclosure, rather than all embodiments of this disclosure. All other embodiments that a person of ordinary skill in the art obtain without creative efforts based on the embodiments of this disclosure shall fall within the protection scope of this disclosure.

Embodiment 1

Figure 1:
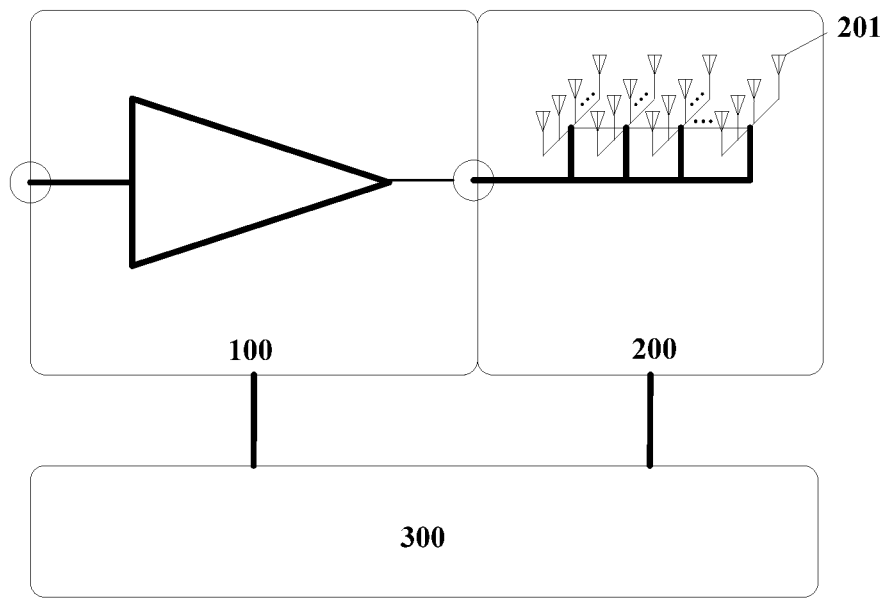
FIG. 1 is a schematic structural diagram of a radio frequency system based on millimeter wave communication according to this disclosure.

In a 5G network, a millimeter wave (Millimeter Wave) band becomes an important communication frequency band. The millimeter wave band has plenty of available spectrum resources that can satisfy increasing traffic requirements of mobile communication. In addition, a wavelength of a millimeter wave is short, and according to an antenna theory, an antenna size in a millimeter wave system may also be small. Therefore, a plurality of antennas can be disposed in a small space. This helps apply a massive MIMO (Massive MIMO) system to an actual system. Although the millimeter wave system has a disadvantage of excessive path fading, a beamforming (Beamforming) technology provided by the massive MIMO system may be used to compensate for the disadvantage of excessive path fading in the millimeter wave system, making it possible to apply a millimeter wave technology to mobile communication. The beamforming technology can improve directivity of an antenna to obtain more apparent array gains. Therefore, the beamforming technology has great advantages in expanding coverage, improving an edge throughput, suppressing interference, and the like. Based on the foregoing description, with reference to technical features of beamforming in an antenna system (that is, good directivity and high array gains of an antenna array), a radio frequency front end of a terminal device may increase the array gains of the antenna array while completing handshake communication with a gNB, thereby reducing transmit power of the terminal device and achieving an objective of power saving. An embodiment of this disclosure provides a radio frequency system based on millimeter wave communication. As shown in FIG. 1, the radio frequency system includes a Doherty power amplification unit 100, an antenna array 200, and a micro control unit MCU 300.

Figure 2:
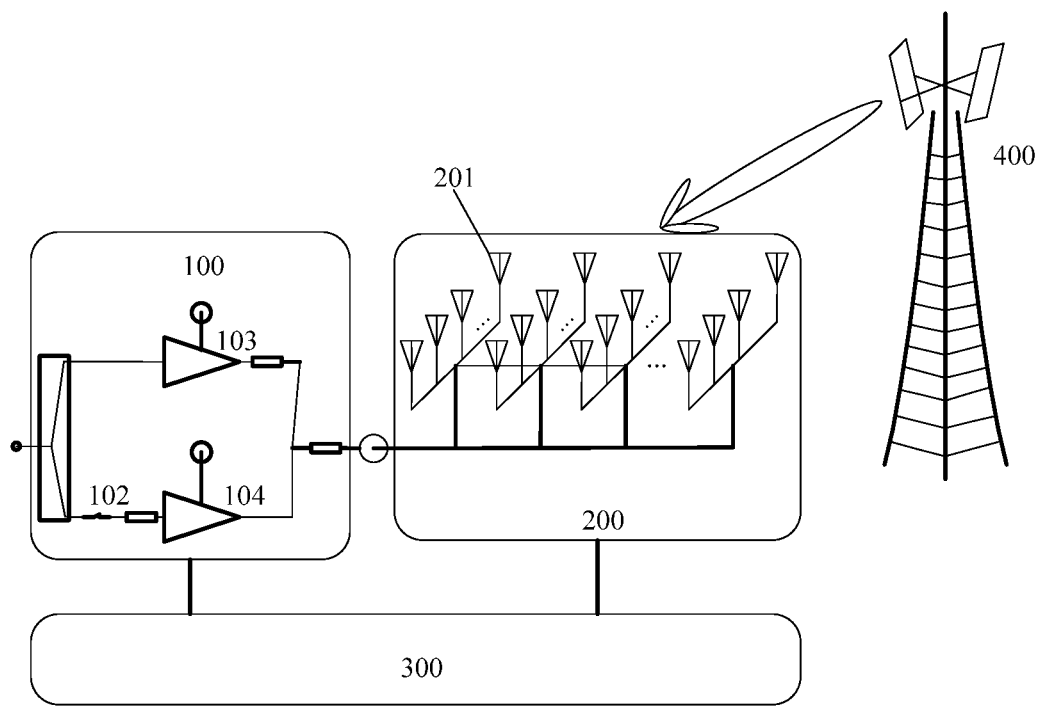
FIG. 2 is another schematic structural diagram of a radio frequency system based on millimeter wave communication according to this disclosure.

As shown in FIG. 2, the Doherty power amplification unit 100 may be a power amplification unit in which two power amplifiers constitute a Doherty structure. The Doherty power amplification unit 100 may include a primary amplifier 103 and a peak amplifier 104 (or secondary amplifier). Power amplifiers may be classified into different types, for example, a class-A amplifier, a class-B amplifier, and a class-AB amplifier. The class-A amplifier is an amplifier that implements a completely linear amplification. When the class-A amplifier works, a positive/negative channel of a transistor is in an always-on state regardless of whether there is a signal. Therefore, a distortion rate of the class-A amplifier is extremely low. The class-B amplifier is a linear amplifier. When the class-B amplifier works, a positive/negative channel of a transistor is usually in an off state. The positive/negative channel of the transistor is turned on only when a signal is input. To be specific, when a positive signal is input, only the positive channel works, and the negative channel is turned off. The two channels do not work at the same time. Therefore, when there is no signal, there is completely no power loss. The class-AB amplifier is an amplifier having advantages of both the class-A amplifier and the class-B amplifier. When there is no signal or when a signal is very small, a positive/negative channel of a transistor is always on. When a signal is a positive signal, the negative channel is always on before the signal becomes strong, and the negative channel is turned off after the signal becomes strong. When a signal is a negative signal, work of the positive channel is exactly contrary to work of the negative channel. Efficiency and fidelity of the class-AB power amplifier are both higher than efficiency and fidelity of the class-A amplifier and the class-B amplifier. The primary amplifier 103 may be a class-B amplifier or a class-AB amplifier. The peak amplifier (104 in FIG. 2) may be a class-C amplifier. The primary amplifier 103 may be always in a working state. The peak amplifier 104 works only when a specified peak arrives. In addition, saturation power of the primary amplifier 103 is not equal to saturation power of the peak amplifier 104. A ratio of the saturation power of the primary amplifier 103 to the saturation power of the peak amplifier 104 may be 1:2, 1:3, or the like.

The Doherty structure of the Doherty power amplification unit 100 can greatly improve transmission efficiency of the radio frequency system in a case of deep backoff. In addition, requirements for transmit power on different levels can also be adaptively satisfied, and the power amplifier can keep working with high efficiency on a full-power level.

As shown in FIG. 1 or FIG. 2, the antenna array 200 may include a plurality of antenna array elements 201. The antenna array 200 may implement beamforming. The beamforming may be a process of generating a directional beam by adjusting a weighting coefficient of each antenna array element 201 in the antenna array, so that apparent array gains can be obtained. Therefore, the beamforming technology has great advantages in expanding coverage, improving an edge throughput, suppressing interference, and the like.

The micro control unit MCU 300 may be a component for sending a control instruction. An algorithm for coordination control between the antenna array 200 and the Doherty power amplification unit 100 may be preset in the micro control unit MCU 300. Based on this algorithm, the micro control unit MCU 300 may send a control instruction to the antenna array 200 and/or the Doherty power amplification unit 100, to control output power of the Doherty power amplification unit 100 and a radiation direction of the antenna array 200.

As shown in FIG. 1 or FIG. 2, to accomplish coordination control between the antenna array 200 and the Doherty power amplification unit 100 by the micro control unit MCU 300, a control end of the Doherty power amplification unit 100 and a control end of the antenna array 200 may be both connected to the MCU 300. In addition, an output end of the Doherty power amplification unit 100 is connected to an input end of the antenna array 200. In this way, the micro control unit MCU 300 can send corresponding control instructions to the Doherty power amplification unit 100 and the antenna array 200 separately, control a radiation direction of each antenna in the antenna array 200 by using a control instruction, and adjust array gains of the antenna array 200 by controlling a radiation direction of the antenna array and using the beamforming technology, thereby reducing transmit power of the radio frequency system and achieving the objective of power saving.

In addition, to fundamentally control the output power of the Doherty power amplification unit 100, the Doherty power amplification unit 100 may be disposed as a power amplification unit including a plurality of power amplifiers. Specifically, as shown in FIG. 2, the Doherty power amplification unit 100 may include two power amplifiers. A power amplifier may be an amplifier that can generate maximum power under a given distortion rate condition and output the maximum power to drive a load. A plurality of power amplifiers may be included. In this embodiment of this disclosure, the two power amplifiers may include the primary amplifier 103 and the peak amplifier 104. The primary amplifier 103 may be a class-B amplifier or a class-AB amplifier. The peak amplifier 104 may be a class-C amplifier or the like. A specific structure of the power amplifier may be set based on an actual situation. This is not limited in this embodiment of this disclosure. In addition, based on structural features of the power amplification unit of the Doherty structure, a ¼ wavelength impedance line for impedance transformation is included after the primary amplifier 103 in the Doherty power amplification unit 100, to reduce apparent impedance of the primary amplifier 103 while assisting the power amplifier in working. In this way, it is ensured that impedance of an active load including the working peak amplifier 104 and a circuit after the peak amplifier 104 is reduced. Therefore, an output current of the primary amplifier 103 becomes larger. Because the primary amplifier 103 is connected to a ¼ wavelength impedance line, to enable in-phase outputting of the two power amplifiers, a phase offset of 90° also needs to be set before the peak amplifier. Because the micro control unit MCU 300 can control the output power of the Doherty power amplification unit 100, if the output power of the Doherty power amplification unit 100 needs to be controlled accurately, one of the two power amplifiers in the Doherty power amplification unit 100 needs to be controlled, or the two power amplifiers need to be controlled separately. Therefore, a switch controller 102, that is, a switch controller 102 in FIG. 2, may be connected in series to the peak amplifier 104. Therefore, the micro control unit MCU 300 can control transmit power of the Doherty power amplification unit 100 by controlling opening and closing of the switch controller 102 in the Doherty power amplification unit 100.

In an actual application, adaptive control of the Doherty power amplification unit 100 and the antenna array 200 is implemented by using the micro control unit MCU 300. To be specific, after the mobile terminal (for example, a terminal device such as a mobile phone or a tablet computer) performs handshake communication with a network-side device 400 (for example, a gNB), the antenna array 200 may increase array gains of an antenna in a direction in the antenna array 200 by using the beamforming technology, and then opening and closing of the switch controller 102 may be controlled to reduce transmit power of the Doherty power amplification unit 100. For example, the micro control unit MCU 300 controls a direction of an antenna in the antenna array 200, and may increase array gains of the antenna based on beamforming when a direction is not reached. If array gains of the antenna array 200 in a direction increase, the micro control unit MCU 300 may send a control signal to the Doherty power amplification unit 100, where the control signal may include a control instruction for opening and/or closing the switch controller 102. After receiving the control signal, the Doherty power amplification unit 100 may open or close the switch controller 102 according to a content indication in the control signal, so that the radio frequency system has optimum transmit power and radiation directivity and that a power loss is reduced.

This embodiment of this disclosure provides a radio frequency system based on millimeter wave communication. The radio frequency system includes a Doherty power amplification unit, an antenna array, and a micro control unit MCU, where an output end of the Doherty power amplification unit is connected to an input end of the antenna array, a control end of the Doherty power amplification unit and a control end of the antenna array are both connected to the MCU, and the MCU controls a radiation direction of an antenna in the antenna array; and the Doherty power amplification unit includes two power amplifiers, saturation power of the two power amplifiers is equal, a switch controller is connected in series to one of the two power amplifiers, and the MCU controls transmit power of the Doherty power amplification unit by controlling opening and closing of the switch controller in the Doherty power amplification unit. Therefore, based on the structure of the radio frequency system, transmit power of the Doherty power amplification unit can be controlled by controlling opening and closing of the switch controller in the Doherty power amplification unit. Efficiency of the power amplifier is improved as much as possible while signal quality is ensured. In addition, standby time of the mobile terminal can be increased by controlling transmit power of the Doherty power amplification unit and further controlling transmit power consumption of the radio frequency system.

Embodiment 2

Figure 3:
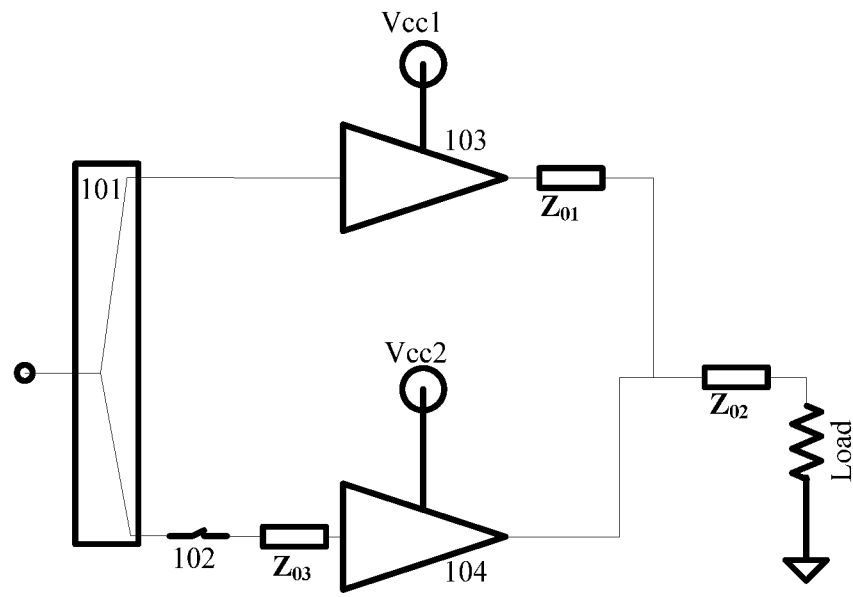
FIG. 3 is still another schematic structural diagram of a radio frequency system based on millimeter wave communication according to this disclosure.
Figure 4:
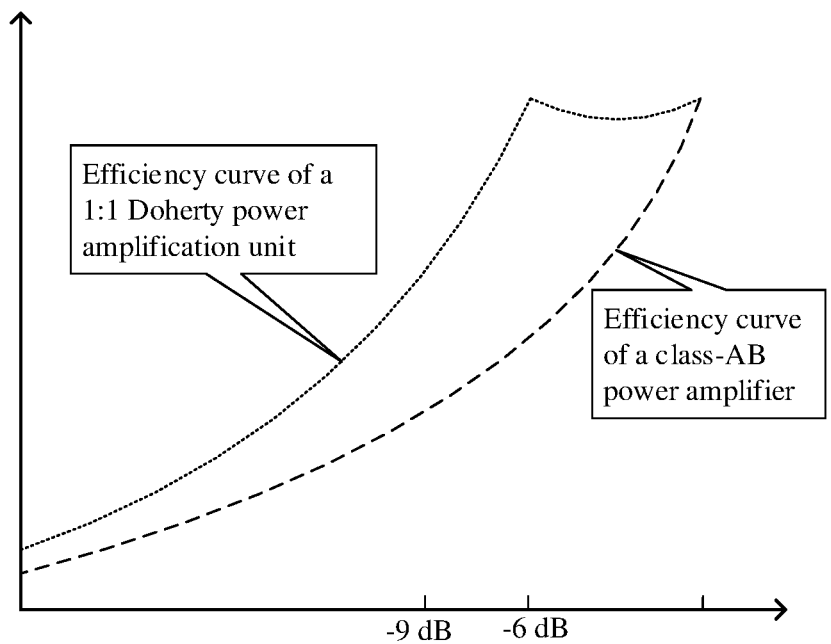
FIG. 4 is a schematic structural diagram of a radio frequency system based on millimeter wave communication according to this disclosure.

This embodiment of this disclosure provides another radio frequency system based on millimeter wave communication. The radio frequency system based on millimeter wave communication includes all functional units of the radio frequency system based on millimeter wave communication as shown in FIG. 1 and FIG. 2. On this basis, some improvements are made, and content of the improvements are as follows:

As shown in FIG. 3, based on features of a power amplification unit of a Doherty structure, the foregoing two power amplifiers may include a primary amplifier 103 and a peak amplifier 104, where the primary amplifier 103 and the peak amplifier 104 are connected in parallel, and a ratio of saturation power of the primary amplifier 103 to saturation power of the peak amplifier 104 may be 1:1, that is, the saturation power of the primary amplifier 103 is equal to the saturation power of the peak amplifier 104. In addition, the primary amplifier 103 and the peak amplifier 104 may constitute a Doherty power amplification unit 100 (in this case, a switch controller 102 connected to the peak amplifier 104 is also in a closed state). The constituted Doherty power amplification unit 100 may be used in a case of high-power transmission. In this case, a feature of high backoff efficiency of the Doherty power amplification unit 100 may be used to greatly improve efficiency in the case of high-power transmission, as shown in FIG. 4. In addition, when the switch controller 102 connected to the peak amplifier 104 is in an open state, the Doherty power amplification unit 100 may form a single-amplifier link, and the single-amplifier link may be used to satisfy a requirement for transmit power on a low power level. This can greatly improve efficiency on the low power level. The primary amplifier 103 may work as a class-AB amplifier. The primary amplifier 103 may keep an always-on state. The peak amplifier 104 works as a class-C amplifier. The peak amplifier 104 may be turned off under low power, and is turned on only after output power rises to a particular value. The primary amplifier 103 may be responsible for low power amplification, and the peak amplifier 104 may be responsible for peak power amplification, and the like.

In addition, as shown in FIG. 3, considering that the Doherty power amplification unit 100 includes two power amplifiers, to evenly distribute power input to the Doherty power amplification unit 100, a one-to-two power splitter 101 may be connected to an input end of the Doherty power amplification unit 100. Therefore, the one-to-two power splitter 101 may be connected to each power amplifier in the Doherty power amplification unit 100 to split an input signal into two signals. A power distribution ratio of the one-to-two power splitter 101 may be flexibly set according to a requirement. To be specific, if the ratio of the saturation power of the primary amplifier 103 to the saturation power of the peak amplifier 104 is 1:1, the power distribution ratio of the one-to-two power splitter 101 may be 1:1. The one-to-two power splitter 101 may distribute the input power in two parts, which are input to the power amplifiers separately. In addition, the switch controller 102 is connected to the peak amplifier 104, and power transmission and processing of the peak amplifier 104 may be further controlled by using the switch controller 102. Moreover, certain isolation between output ports of the one-to-two power splitter 101 may be ensured. Therefore, a power loss can be reduced as much as possible.

In addition, as shown in FIG. 3, the radio frequency system further includes a plurality of ¼ wavelength impedance lines. The ¼ wavelength impedance lines may implement impedance transformation, that is, transform low impedance of a bias circuit into high impedance to achieve an objective of high frequency isolation. Based on functions of the ¼ wavelength impedance lines and features of the power amplification unit of the Doherty structure, the ¼ wavelength impedance lines may be disposed at an output end of the primary amplifier 103 and an input end of the peak amplifier 104. To be specific, a first ¼ wavelength impedance line, for example, Z01 in FIG. 3, is disposed at the output end of the primary amplifier 103; and a third ¼ wavelength impedance line, for example, Z03 in FIG. 3, is disposed at the input end of the peak amplifier 104. In addition, after the output end of the primary amplifier 103 is connected to an output end of the peak amplifier 104 by using the first ¼ wavelength impedance line Z01, the output end of the primary amplifier 103 is further connected to a second ¼ wavelength impedance line (for example, Z02 in FIG. 3). The ¼ wavelength impedance lines are placed at the input and output ends of the two power amplifiers. The ¼ wavelength impedance line placed at the input end can implement a function of phase balancing. The ¼ wavelength impedance line placed at the output end can implement functions of impedance traction and matching. In addition, characteristic impedance of both Z01 and Z03 may be 50 ohm, and characteristic impedance of Z02 may be 35 ohm.

In addition, the Doherty power amplification unit 100 may include two power supplies, that is, a first power supply Vcc1 and a second power supply Vcc2. The primary amplifier 103 may be connected to the first power supply Vcc1. The peak amplifier 104 may be connected to the second power supply Vcc2. The radio frequency system may further include a plurality of APT circuits, for example, a first APT circuit and a second APT circuit. The first APT circuit and the second APT circuit are independent of each other. The two independent APT circuits may respectively implement an APT function to improve efficiency of the power amplifiers. The first power supply Vcc1 connected to the primary amplifier 103 may be further connected to the first APT circuit. The second power supply Vcc2 connected to the peak amplifier 104 may be connected to the second APT circuit.

In addition, the antenna array 200 may include a plurality of antenna array elements 201. The antenna array elements 201 may be associated with a common interface by using a matching network and connected to an output end of the Doherty power amplification unit 100 by using the common interface.

Figure 5:
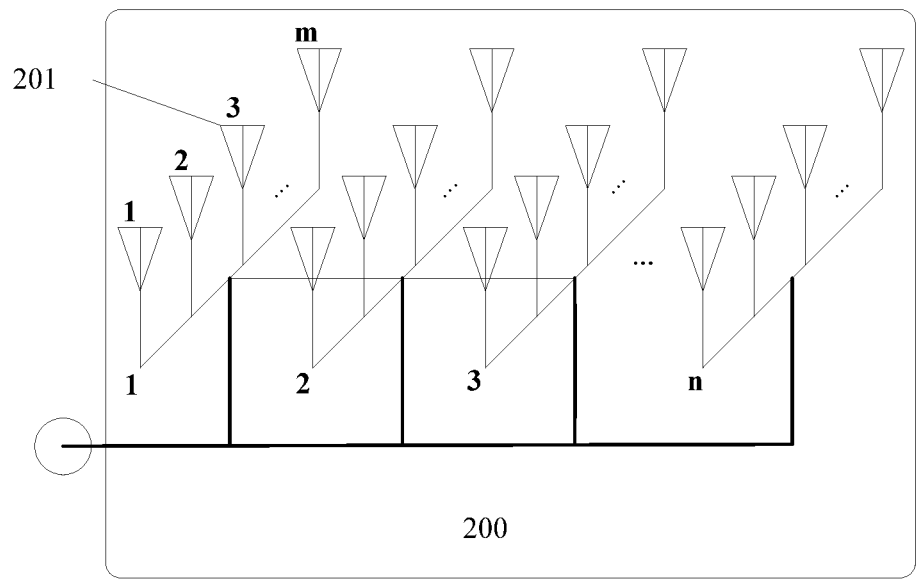
FIG. 5 is a schematic structural diagram of a radio frequency system based on millimeter wave communication according to this disclosure.

As shown in FIG. 5, the antenna array 200 includes m×n antenna array elements 201, where m represents m rows, and n represents n columns. The m×n antenna array elements 201 are associated with a common port by using the matching network, and connected to the output end of the Doherty power amplification unit 100 by using the same port. A control end of the MCU is connected to the Doherty power amplification unit 100 and the antenna array 200 to implement coordination control.

Figure 6:
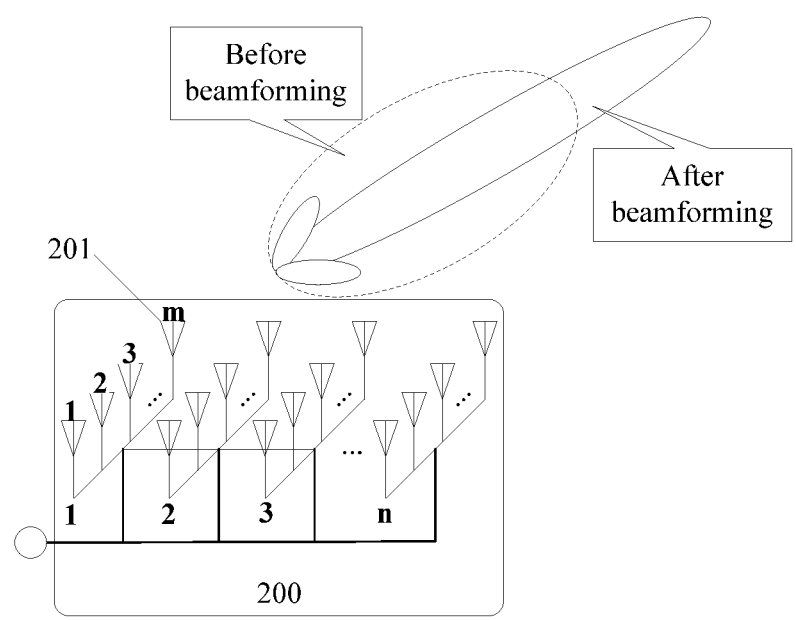
FIG. 6 is a schematic structural diagram of a radio frequency system based on millimeter wave communication according to this disclosure.

In an actual application, as shown in FIG. 6, after the mobile terminal performs handshake communication with a network-side device 400, the antenna array 200 may increase array gains of an antenna in a direction in the antenna array 200 by using a beamforming technology, and then opening and closing of the switch controller 102 may be controlled to reduce transmit power of the Doherty power amplification unit 100, so that the radio frequency system has optimum transmit power and radiation directivity and that a power loss is reduced.

This embodiment of this disclosure provides a radio frequency system based on millimeter wave communication. The radio frequency system includes a Doherty power amplification unit, an antenna array, and a micro control unit MCU, where an output end of the Doherty power amplification unit is connected to an input end of the antenna array, a control end of the Doherty power amplification unit and a control end of the antenna array are both connected to the MCU, and the MCU controls a radiation direction of an antenna in the antenna array; and the Doherty power amplification unit includes two power amplifiers, saturation power of the two power amplifiers is equal, a switch controller is connected in series to one of the two power amplifiers, and the MCU controls transmit power of the Doherty power amplification unit by controlling opening and closing of the switch controller in the Doherty power amplification unit. Therefore, based on the structure of the radio frequency system, transmit power of the Doherty power amplification unit can be controlled by controlling opening and closing of the switch controller in the Doherty power amplification unit. Efficiency of the power amplifier is improved as much as possible while signal quality is ensured. In addition, standby time of the mobile terminal can be increased by controlling transmit power of the Doherty power amplification unit and further controlling transmit power consumption of the radio frequency system.

Embodiment 3

Figure 7:
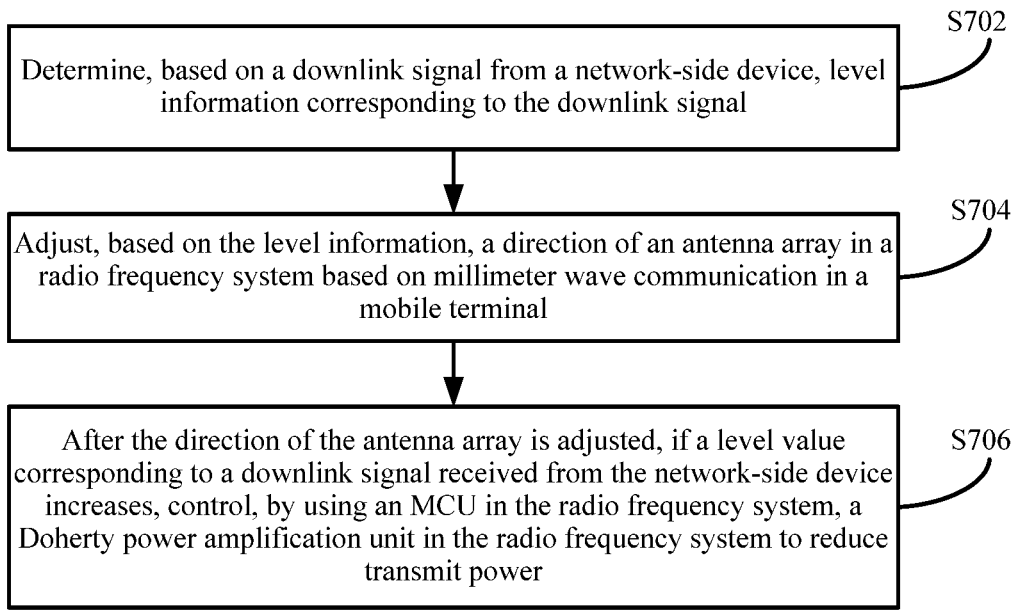
FIG. 7 is an embodiment of a method for adjusting transmit power according to this disclosure.

As shown in FIG. 7, this embodiment of this disclosure provides a method for adjusting transmit power. The method may be performed by a mobile terminal. The mobile terminal may include the radio frequency system based on millimeter wave communication in Embodiment 1 or Embodiment 2 above. The mobile terminal may be, for example, a mobile phone or a tablet computer. The mobile terminal may be a mobile terminal used by a user. The method may be applied to processing in the radio frequency system in the mobile terminal, such as adjusting transmit power. This method may specifically include the following steps.

Step S702: Determine, based on a downlink signal from a network-side device, level information corresponding to the downlink signal.

A network-side device 400 may be a device used to communicate with a mobile terminal (for example, a terminal device such as a mobile phone or a tablet computer). The network-side device 400 may be a base transceiver station (Base Transceiver Station, BTS) in a global system for mobile communications (Global System for Mobile Communications, GSM) or a code division multiple access (Code Division Multiple Access, CDMA) system; or may be a NodeB (NodeB, NB) in a wideband code division multiple access (Wideband Code Division Multiple Access, WCDMA) system; or may further be an evolved NodeB (Evolved NodeB, eNB or eNodeB) in a long term evolution (Long Term Evolution, LTE) system, an access point, an in-vehicle device, a wearable device, a network-side device 400 in a future 5G network, a network-side device 400 in a future evolved public land mobile network (Public Land Mobile Network, PLMN), or the like.

In an implementation, after the mobile terminal establishes a communication connection to the network-side device 400, the mobile terminal may receive a downlink signal sent by the network-side device 400. To better control beamforming, the mobile terminal may convert the received downlink signal into level value information, where a value of each level may correspond to one power value, and is used to display signal strength of the current downlink signal. Because signal reception and signal transmission by an antenna are mutually reciprocal processes, level value information corresponding to a received downlink signal may be used as a basis for controlling beamforming, to improve transmission performance.

Step S704: Adjust, based on the level information, a direction of an antenna array in a radio frequency system based on millimeter wave communication in the mobile terminal.

In an implementation, after the mobile terminal receives the downlink signal and converts the downlink signal into the level information, the mobile terminal may record the level information corresponding to the downlink signal, compare the level information with level information corresponding to a previously received downlink signal or with reference level information, determine whether a level value in the currently obtained level information is greater than or less than a level value in the previously obtained level information or the reference level information, and correspondingly adjust a direction of each antenna array element 201 in an antenna array 200 in the radio frequency system based on a comparison result. For example, if the level value in the currently obtained level information is greater than the level value in the previously obtained level information or the reference level information, the mobile terminal may continue to maintain a current moving direction and adjust the direction of the antenna array in the radio frequency system; or if the level value in the currently obtained level information is less than the level value in the previously obtained level information or the reference level information, the mobile terminal may move in a direction opposite to a current moving direction, and adjust the direction of the antenna array in the radio frequency system.

Step S706: After the direction of the antenna array is adjusted, if a level value corresponding to a downlink signal received from the network-side device 400 increases, control a Doherty power amplification unit in the radio frequency system to reduce transmit power by using an MCU in the radio frequency system.

In an implementation, in a process of establishing communication with the network-side device 400 by the mobile terminal, the mobile terminal may change a direction of a beam sent by the antenna array 200 to find a maximum value of a level corresponding to the received downlink signal (the beam direction is an antenna direction of the network-side device 400), and after determining the direction of the beam sent by the antenna array 200, the mobile terminal may adjust a beam width of the antenna array, so that transmit signals are more concentrated, thereby increasing array gains of the antenna array in this direction. After the directivity and beam width of the antenna in the antenna array 200 are optimized, the micro control unit MCU 300 may control connection/disconnection of a switch controller 102 in the Doherty power amplification unit 100 based on a preset adaptive algorithm, to synchronously control a working state of a power amplifier in the antenna array 200, reduce transmit power of the mobile terminal, and achieve optimum efficiency.

This embodiment of this disclosure provides a method for adjusting transmit power. The method may be applied to a radio frequency system based on millimeter wave communication. The radio frequency system includes a Doherty power amplification unit, an antenna array, and a micro control unit MCU, where an output end of the Doherty power amplification unit is connected to an input end of the antenna array, a control end of the Doherty power amplification unit and a control end of the antenna array are both connected to the MCU, and the MCU controls a radiation direction of an antenna in the antenna array; and the Doherty power amplification unit includes two power amplifiers, saturation power of the two power amplifiers is equal, a switch controller is connected in series to one of the two power amplifiers, and the MCU controls transmit power of the Doherty power amplification unit by controlling opening and closing of the switch controller in the Doherty power amplification unit. Therefore, based on the structure of the radio frequency system, transmit power of the Doherty power amplification unit can be controlled by controlling opening and closing of the switch controller in the Doherty power amplification unit. Efficiency of the power amplifier is improved as much as possible while signal quality is ensured. In addition, standby time of the mobile terminal can be increased by controlling transmit power of the Doherty power amplification unit and further controlling transmit power consumption of the radio frequency system.

Embodiment 4

Figure 8:
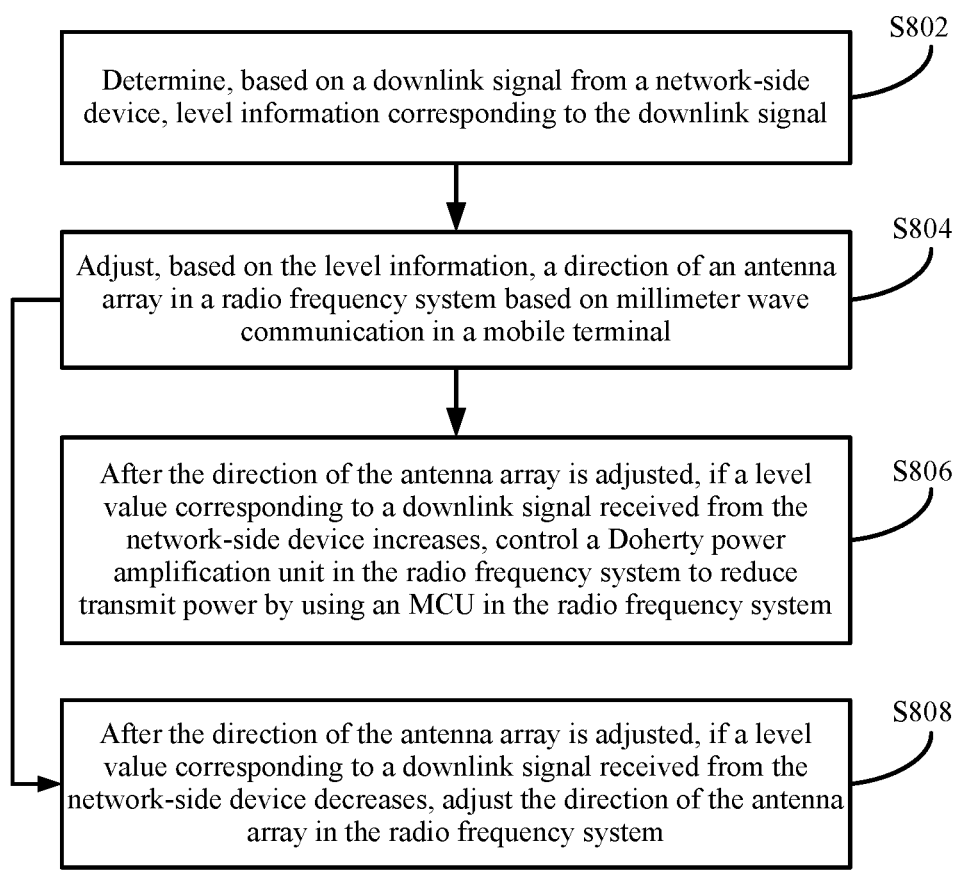
FIG. 8 is another embodiment of a method for adjusting transmit power according to this disclosure.

As shown in FIG. 8, this embodiment of this disclosure provides a method for adjusting transmit power. The method may be performed by a mobile terminal. The mobile terminal may include the radio frequency system based on millimeter wave communication in Embodiment 1 or Embodiment 2 above. The mobile terminal may be, for example, a mobile phone or a tablet computer. The mobile terminal may be a mobile terminal used by a user. The method may be applied to processing in the radio frequency system in the mobile terminal, such as adjusting transmit power. This method may specifically include the following steps.

Step S802: Determine, based on a downlink signal from a network-side device 400, level information corresponding to the downlink signal.

Step S804: Adjust, based on the level information, a direction of an antenna array in a radio frequency system based on millimeter wave communication in a mobile terminal.

Step S806: After the direction of the antenna array is adjusted, if a level value corresponding to a downlink signal received from the network-side device 400 increases, control, by using an MCU in the radio frequency system, a Doherty power amplification unit in the radio frequency system to reduce transmit power.

Content of step S802 to step S806 is the same as content of step S702 to step S706 in Embodiment 3 above. For specific processing of step S802 to step S806, refer to related content of step S702 to step S706. Details are not described again herein.

Step S808: After the direction of the antenna array is adjusted, if a level value corresponding to a downlink signal received from the network-side device 400 decreases, adjust the direction of the antenna array in the radio frequency system.

In an implementation, in a process of establishing communication with the network-side device 400 by the mobile terminal, after the direction of the antenna array is adjusted, if the level value corresponding to the downlink signal received from the network-side device 400 decreases, it indicates that array gains of a beam currently sent by an antenna array 200 in the current direction do not increase. In this case, the mobile terminal may continue to adjust the direction of the antenna array in the radio frequency system to find a maximum value of a level corresponding to the received downlink signal (the beam direction is an antenna direction of the network-side device 400), and after determining the direction of the beam sent by the antenna array 200, the mobile terminal may adjust a beam width of the antenna array, so that transmit signals are more concentrated. In addition, the micro control unit MCU 300 may control connection/disconnection of a switch controller 102 in the Doherty power amplification unit 100 based on a preset adaptive algorithm, to synchronously control a working state of a power amplifier in the antenna array 200, reduce transmit power of the mobile terminal, and achieve optimum efficiency.

This embodiment of this disclosure provides a method for adjusting transmit power. The method may be applied to a radio frequency system based on millimeter wave communication. The radio frequency system includes a Doherty power amplification unit, an antenna array, and a micro control unit MCU, where an output end of the Doherty power amplification unit is connected to an input end of the antenna array, a control end of the Doherty power amplification unit and a control end of the antenna array are both connected to the MCU, and the MCU controls a radiation direction of an antenna in the antenna array; and the Doherty power amplification unit includes two power amplifiers, saturation power of the two power amplifiers is equal, a switch controller is connected in series to one of the two power amplifiers, and the MCU controls transmit power of the Doherty power amplification unit by controlling opening and closing of the switch controller in the Doherty power amplification unit. Therefore, based on the structure of the radio frequency system, transmit power of the Doherty power amplification unit can be controlled by controlling opening and closing of the switch controller in the Doherty power amplification unit. Efficiency of the power amplifier is improved as much as possible while signal quality is ensured. In addition, standby time of the mobile terminal can be increased by controlling transmit power of the Doherty power amplification unit and further controlling transmit power consumption of the radio frequency system.

Embodiment 5

Figure 9:
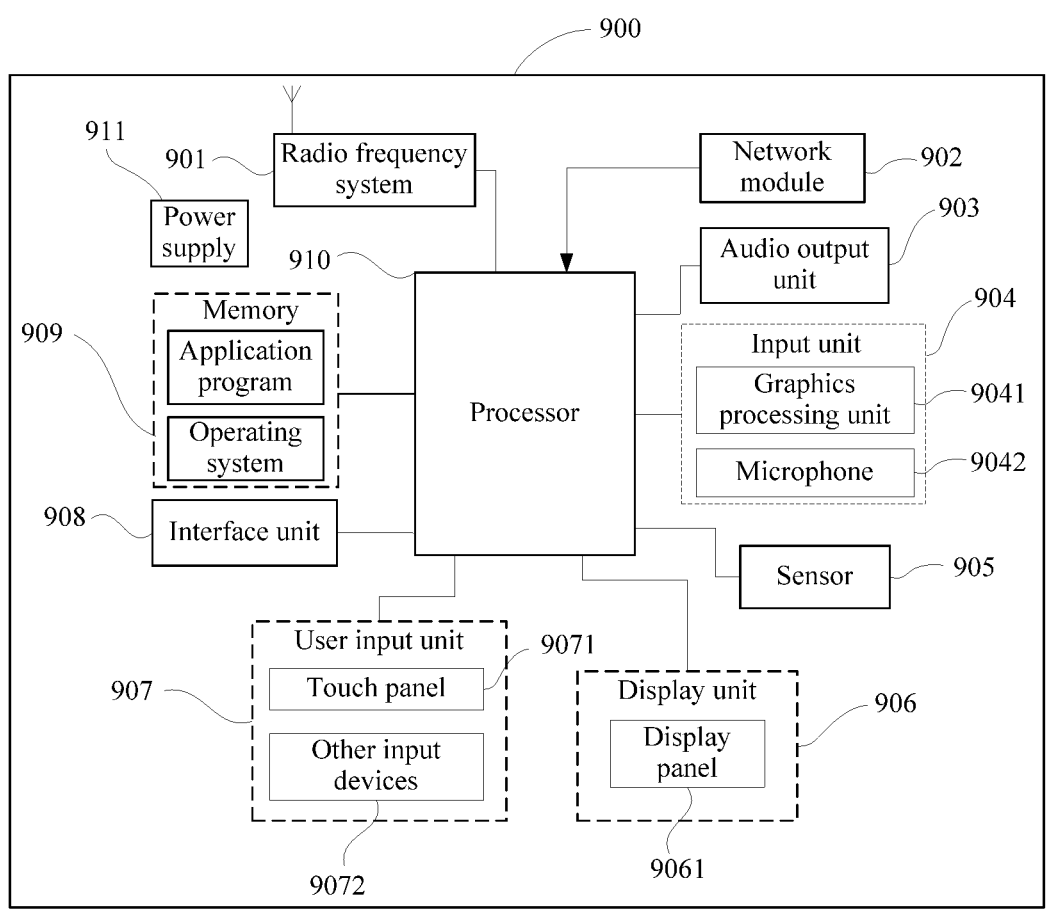
FIG. 9 is an embodiment of a mobile terminal according to this disclosure.

FIG. 9 is a schematic structural diagram of hardware of a mobile terminal for implementing each embodiment of this disclosure.

The mobile terminal 900 includes a radio frequency system 901 based on millimeter wave communication. In addition, the mobile terminal 900 may further include but is not limited to the following components: a network module 902, an audio output unit 903, an input unit 904, a sensor 905, a display unit 906, a user input unit 907, an interface unit 908, a memory 909, a processor 910, and a power supply 911. A person skilled in the art may understand that the mobile terminal is not limited to the structure of the mobile terminal shown in FIG. 9. The mobile terminal may include more or fewer parts than that shown in the figure, or some parts may be combined, or an arrangement of parts may be different. In this embodiment of this disclosure, the mobile terminal includes but is not limited to a mobile phone, a tablet computer, a notebook computer, a palmtop computer, an in-vehicle terminal, a wearable device, a pedometer, and the like.

The radio frequency system 901 based on millimeter wave communication includes a Doherty power amplification unit, an antenna array, and a micro control unit MCU, where an output end of the Doherty power amplification unit is connected to an input end of the antenna array, a control end of the Doherty power amplification unit and a control end of the antenna array are both connected to the MCU, and the MCU controls a radiation direction of an antenna in the antenna array; and the Doherty power amplification unit includes two power amplifiers, saturation power of the two power amplifiers is equal, a switch controller is connected in series to one of the two power amplifiers, and the MCU controls transmit power of the Doherty power amplification unit by controlling opening and closing of the switch controller.

In this embodiment of this disclosure, an input end of the Doherty power amplification unit is connected to a one-to-two power splitter, and the one-to-two power splitter is connected to each power amplifier.

In this embodiment of this disclosure, the two power amplifiers include a primary amplifier and a peak amplifier, where the peak amplifier is connected in series to the switch controller, and the primary amplifier is connected in parallel with the peak amplifier.

In this embodiment of this disclosure, the radio frequency system further includes a plurality of ¼ wavelength impedance lines, a first ¼ wavelength impedance line is disposed at an output end of the primary amplifier, a third ¼ wavelength impedance line is disposed at an input end of the peak amplifier, and after the output end of the primary amplifier is connected to an output end of the peak amplifier by using the first ¼ wavelength impedance line, the output end of the primary amplifier is further connected to a second ¼ wavelength impedance line.

In this embodiment of this disclosure, the primary amplifier is connected to a first power supply, and the peak amplifier is connected to a second power supply.

In this embodiment of this disclosure, the first power supply connected to the primary amplifier is connected to a first APT circuit, and the second power supply connected to the peak amplifier is connected to a second APT circuit.

In this embodiment of this disclosure, the antenna array includes a plurality of antenna array elements, and the antenna array elements are associated with a common interface by using a matching network and connected to the output end of the Doherty power amplification unit by using the common interface.

The radio frequency system 901 is configured to determine, based on a downlink signal from a network-side device, level information corresponding to the downlink signal.

The radio frequency system 901 is further configured to adjust, based on the level information, a direction of an antenna array in the radio frequency system based on millimeter wave communication in the mobile terminal.

After the direction of the antenna array is adjusted, if a level value corresponding to a downlink signal received from the network-side device increases, the radio frequency system 901 is further configured to control the Doherty power amplification unit in the radio frequency system to reduce transmit power by using the MCU in the radio frequency system.

In addition, after the direction of the antenna array is adjusted, if a level value corresponding to a downlink signal received from the network-side device decreases, the radio frequency system 901 is further configured to adjust the direction of the antenna array in the radio frequency system.

This embodiment of this disclosure provides a mobile terminal. The mobile terminal may include a radio frequency system based on millimeter wave communication. The radio frequency system includes a Doherty power amplification unit, an antenna array, and a micro control unit MCU, where an output end of the Doherty power amplification unit is connected to an input end of the antenna array, a control end of the Doherty power amplification unit and a control end of the antenna array are both connected to the MCU, and the MCU controls a radiation direction of an antenna in the antenna array; and the Doherty power amplification unit includes two power amplifiers, saturation power of the two power amplifiers is equal, a switch controller is connected in series to one of the two power amplifiers, and the MCU controls transmit power of the Doherty power amplification unit by controlling opening and closing of the switch controller in the Doherty power amplification unit. Therefore, based on the structure of the radio frequency system, transmit power of the Doherty power amplification unit can be controlled by controlling opening and closing of the switch controller in the Doherty power amplification unit. Efficiency of the power amplifier is improved as much as possible while signal quality is ensured. In addition, standby time of the mobile terminal can be increased by controlling transmit power of the Doherty power amplification unit and further controlling transmit power consumption of the radio frequency system.

It should be understood that in this embodiment of this disclosure, the radio frequency system 901 may be configured to receive and send signals in an information reception or transmission or call process. Specifically, after receiving downlink data from a gNB, the radio frequency system 901 sends the downlink data to the processor 910 for processing. In addition, the radio frequency system 901 sends uplink data to the gNB. Generally, the radio frequency system 901 includes but is not limited to an antenna, at least one amplifier, a transceiver, a coupler, a low noise amplifier, a duplexer, and the like. In addition, the radio frequency system 901 may further communicate with a network and another device by using a wireless communications system.

The mobile terminal provides wireless broadband Internet access for a user by using the network module 902, for example, helps the user send and receive e-mails, browse web pages, and access streaming media.

The audio output unit 903 may convert audio data received by the radio frequency system 901 or the network module 902 or audio data stored in the memory 909 into an audio signal, and output the audio signal as a sound. In addition, the audio output unit 903 may further provide an audio output (for example, a call signal reception sound or a message reception sound) related to a specific function performed by the mobile terminal 900. The audio output unit 903 includes a speaker, a buzzer, a phone receiver, and the like.

The input unit 904 is configured to receive an audio or video signal. The input unit 904 may include a graphics processing unit (Graphics Processing Unit, GPU) 9041 and a microphone 9042. The graphics processing unit 9041 processes a still image or image data of a video obtained by an image capture apparatus (for example, a camera) in a video capture mode or an image capture mode. A processed image frame may be displayed on the display unit 906. The image frame processed by the graphics processing unit 9041 may be stored in the memory 909 (or another storage medium), or sent by the radio frequency system 901 or the network module 902. The microphone 9042 may receive a sound, and can process the sound into audio data. The processed audio data may be converted in a phone call mode into a format that can be sent by the radio frequency system 901 to a mobile communications gNB for outputting.

The mobile terminal 900 further includes at least one sensor 905, for example, a light sensor, a motion sensor, and other sensors. Specifically, the light sensor includes an ambient light sensor and a proximity sensor, where the ambient light sensor may adjust luminance of a display panel 9061 based on brightness of ambient light, and the proximity sensor may turn off and/or backlight the display panel 9061 when the mobile terminal 900 moves to an ear. As a type of motion sensor, an accelerometer sensor may detect acceleration magnitudes in all directions (generally three axes), and when the accelerometer sensor is stationary, may detect a magnitude and a direction of gravity, and may be configured to recognize a posture of the mobile terminal (such as switching between landscape and portrait, related games, and magnetometer posture calibration), implement vibration recognition related functions (such as a pedometer and stroke), and the like. The sensor 905 may further include a fingerprint sensor, a pressure sensor, an iris sensor, a molecular sensor, a gyroscope, a barometer, a hygrometer, a thermometer, an infrared sensor, and the like. Details are not described herein.

The display unit 906 is configured to display information input by the user or information provided for the user. The display unit 906 may include a display panel 9061. The display panel 9061 may be configured in a form of a liquid crystal display (Liquid Crystal Display, LCD), an organic light-emitting diode (Organic Light-Emitting Diode, OLED), or the like.

The user input unit 907 may be configured to receive input digit or character information, and generate a key signal input related to a user setting and function control of the mobile terminal. Specifically, the user input unit 907 includes a touch panel 9071 and other input devices 9072. The touch panel 9071, also referred to as a touchscreen, may capture a touch operation of the user on or near the touch panel (for example, an operation performed by the user by using any appropriate object or accessory such as a finger or a stylus on the touch panel 9071 or near the touch panel 9071). The touch panel 9071 may include two parts: a touch detection apparatus and a touch controller. The touch detection apparatus detects a touch direction of the user, detects a signal generated by the touch operation, and transmits the signal to the touch controller. The touch controller receives the touch signal from the touch detection apparatus, converts the touch signal into touch point coordinates, transmits the touch point coordinates to the processor 910, receives a command transmitted by the processor 910, and executes the command In addition, the touch panel 9071 may be a resistive touch panel, a capacitive touch panel, an infrared touch panel, or a surface acoustic wave touch panel. In addition to the touch panel 9071, the user input unit 907 may further include the other input devices 9072. Specifically, the other input devices 9072 may include but are not limited to a physical keyboard, a function key (such as a volume control key or a power-on/off key), a trackball, a mouse, a joystick, and the like. Details are not described herein.

Further, the touch panel 9071 may cover the display panel 9061. When the touch panel 9071 detects a touch operation on or near the touch panel, the touch panel 9071 transmits the touch operation to the processor 910 to determine a type of a touch event. Then the processor 910 provides a corresponding visual output on the display panel 9061 based on the type of the touch event. Although the touch panel 9071 and the display panel 9061 are used as two independent components to implement input and output functions of the mobile terminal in FIG. 9, the touch panel 9071 and the display panel 9061 may be integrated to implement the input and output functions of the mobile terminal in some embodiments. This is not specifically limited herein.

The interface unit 908 is an interface for connecting an external apparatus to the mobile terminal 900. For example, the external apparatus may include a wired or wireless headphone port, an external power (or battery charger) port, a wired or wireless data port, a memory card port, a port for connecting an apparatus having a recognition module, an audio input/output (I/O) port, a video I/O port, an earphone port, and the like. The interface unit 908 may be configured to receive an input (for example, data information or power) from the external apparatus, and transmit the received input to one or more components in the mobile terminal 900, or may be configured to transmit data between the mobile terminal and the external apparatus.

The memory 909 may be configured to store a software program and various types of data. The memory 909 may mainly include a program storage area and a data storage area. The program storage area may store an operating system, an application program required by at least one function (such as an audio playing function or an image playing function), or the like. The data storage area may store data (such as audio data or a phone book) that is created based on usage of the mobile phone, or the like. In addition, the memory 909 may include a high-speed random access memory, and may further include a non-volatile memory, for example, at least one magnetic disk storage device, a flash memory, or another non-volatile solid-state storage device.

The processor 910 is a control center of the mobile terminal. The processor 910 uses various interfaces and lines to connect all parts of the entire mobile terminal, and executes various functions and data processing of the mobile terminal by running or executing the software program and/or module stored in the memory 909 and invoking data stored in the memory 909, thereby performing overall monitoring on the mobile terminal. The processor 910 may include one or more processing units. Preferably, the processor 910 may integrate an application processor and a modem processor. The application processor mainly processes the operating system, a user interface, an application program, and the like. The modem processor mainly processes wireless communication. It may be understood that alternatively, the modem processor may not be integrated with the processor 910.

The mobile terminal 900 may further include the power supply 911 (such as a battery) supplying power to each component. Preferably, the power supply 911 may be logically connected to the processor 910 by using a power management system, so that functions such as charge and discharge management and power consumption management are implemented by using the power management system.

Preferably, this embodiment of this disclosure further provides a mobile terminal, including a processor 910, a memory 909, and a computer program that is stored in the memory 909 and can be run by the processor 910. When the computer program is executed by the processor 910, each process of the foregoing embodiment of the method for adjusting transmit power is implemented, and a same technical effect can be achieved. Details are not described again herein to avoid repetition.

Embodiment 6

This embodiment of this disclosure further provides a computer-readable storage medium, where the computer-readable storage medium stores a computer program. When the computer program is executed by a processor, each process of the foregoing embodiment of the method for adjusting transmit power is implemented, and a same technical effect can be achieved. Details are not described again herein to avoid repetition. The computer-readable storage medium may be, for example, a read-only memory (Read-Only Memory, ROM), a random access memory (Random Access Memory, RAM), a magnetic disk, or an optical disc.

This embodiment of this disclosure provides a computer-readable storage medium. Based on the structure of the foregoing radio frequency system, transmit power of a Doherty power amplification unit can be controlled by controlling opening and closing of a switch controller in the Doherty power amplification unit. Efficiency of a power amplifier is improved as much as possible while signal quality is ensured. In addition, standby time of a mobile terminal can be increased by controlling transmit power of the Doherty power amplification unit and further controlling transmit power consumption of the radio frequency system.

A person skilled in the art should understand that the embodiments of this disclosure may be provided as a method, a system, or a computer program product. Therefore, this disclosure may use a form of hardware only embodiments, software only embodiments, or embodiments with a combination of software and hardware. Moreover, this disclosure may use a form of a computer program product that is implemented on one or more computer-usable storage media (including but not limited to a disk memory, a CD-ROM, an optical memory, and the like) that include computer-usable program code.

This disclosure is described with reference to the flowcharts and/or block diagrams of the method, the device (system), and the computer program product according to the embodiments of this disclosure. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, so that the instructions executed by a computer or a processor of any other programmable data processing device generate an apparatus for implementing a specific function in one or more processes in the flowcharts and/or in one or more blocks in the block diagrams.

These computer program instructions may be stored in a computer-readable memory that can instruct the computer or any other programmable data processing device to work in a specific manner, so that the instructions stored in the computer-readable memory generate an artifact that includes an instruction apparatus. The instruction apparatus implements a specific function in one or more processes in the flowcharts and/or in one or more blocks in the block diagrams.

These computer program instructions may be loaded onto a computer or another programmable data processing device, so that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the block diagrams.

In a typical configuration, a computer includes one or more processors (CPU), an input/output interface, a network interface, and a memory.

The memory may include a non-persistent memory or a random access memory (RAM), and/or a non-volatile memory in computer-readable media, for example, a read-only memory (ROM) or a flash memory (flash RAM). The memory is an example of a computer-readable medium.

The computer-readable media include persistent media, non-persistent media, removable media, and non-removable media, and information storage may be implemented by using any method or technology. Information may be a computer-readable instruction, a data structure, a program module, or other data. An example of a computer storage medium includes but is not limited to: a phase change memory (PRAM), a static random access memory (SRAM), a dynamic random access memory (DRAM), another type of random access memory (RAM), a read-only memory (ROM), an electrically erasable programmable read-only memory (EEPROM), a flash memory or another memory, a compact disc read-only memory (CD-ROM), a digital versatile disc (DVD) or other optical storage, a cassette magnetic tape, magnetic tape or disk storage, another magnetic storage device, or any other non-transmission medium, which may be configured to store information that can be accessed by the computer. As defined in this specification, the computer-readable media do not include computer-readable transitory media (transitory media), for example, a modulated data signal and a carrier.

It should also be noted that the terms "comprise", "include", or any of their variants is intended to cover a non-exclusive inclusion, such that a process, a method, a commodity, or a device that includes a list of elements not only includes those elements but also includes other elements that are not expressly listed, or further includes elements inherent to such process, method, commodity, or device. In absence of more constraints, an element preceded by "includes a . . . " does not preclude the existence of other identical elements in the process, method, commodity, or apparatus that includes the element.

A person skilled in the art should understand that the embodiments of this disclosure may be provided as a method, a system, or a computer program product. Therefore, this disclosure may use a form of hardware only embodiments, software only embodiments, or embodiments with a combination of software and hardware. Moreover, this disclosure may use a form of a computer program product that is implemented on one or more computer-usable storage media (including but not limited to a disk memory, a CD-ROM, an optical memory, and the like) that include computer-usable program code.

The foregoing descriptions are merely embodiments of this disclosure, but are not intended to limit this disclosure. For a person skilled in the art, this disclosure may be subject to various changes and variations. Any modification, equivalent replacement, or improvement made without departing from the spirit and principle of this disclosure should fall within the scope of the claims of this disclosure.

What is claimed is:

1. A radio frequency system based on millimeter wave communication, wherein the radio frequency system comprises a Doherty power amplification unit, an antenna array, and a micro control unit MCU, wherein
   an output end of the Doherty power amplification unit is connected to an input end of the antenna array, a control end of the Doherty power amplification unit and a control end of the antenna array are both connected to the MCU, and the MCU controls a radiation direction of an antenna in the antenna array; and
   the Doherty power amplification unit comprises two power amplifiers, saturation power of the two power amplifiers is equal, a switch controller is connected in series to one of the two power amplifiers, and the MCU is configured to control array gains of the antenna array, and controls, in a case that the array gains of the antenna array increase, controls transmit power of the Doherty power amplification unit by controlling opening and closing of the switch controller.

2. The radio frequency system according to claim 1, wherein an input end of the Doherty power amplification unit is connected to a one-to-two power splitter, and the one-to-two power splitter is connected to each power amplifier.

3. The radio frequency system according to claim 2, wherein the two power amplifiers comprise a primary amplifier and a peak amplifier, wherein the peak amplifier is connected in series to the switch controller, and the primary amplifier is connected in parallel with the peak amplifier.

4. The radio frequency system according to claim 3, wherein the radio frequency system further comprises a plurality of ¼ wavelength impedance lines, a first ¼ wavelength impedance line is disposed at an output end of the primary amplifier, a third ¼ wavelength impedance line is disposed at an input end of the peak amplifier, and after the output end of the primary amplifier is connected to an output end of the peak amplifier by using the first ¼ wavelength impedance line, the output end of the primary amplifier is further connected to a second ¼ wavelength impedance line.

5. The radio frequency system according to claim 4, wherein the primary amplifier is connected to a first power supply, and the peak amplifier is connected to a second power supply.

6. The radio frequency system according to claim 5, wherein the first power supply is connected to a first APT circuit, and the second power supply is connected to a second APT circuit.

7. The radio frequency system according to claim 6, wherein the antenna array comprises a plurality of antenna array elements, and the antenna array elements are associated with a common interface by using a matching network and connected to the output end of the Doherty power amplification unit by using the common interface.

8. A mobile terminal, comprising the radio frequency system based on millimeter wave communication according to claim 1.

9. A method for adjusting transmit power, wherein the method is applied to the mobile terminal according to claim 8, and the method comprises:
   determining, based on a downlink signal from a network-side device, level information corresponding to the downlink signal;
   adjusting, based on the level information, a direction of an antenna array in the radio frequency system based on millimeter wave communication in the mobile terminal; and
   after the direction of the antenna array is adjusted, if a level value corresponding to a downlink signal received from the network-side device increases, controlling the Doherty power amplification unit in the radio frequency system to reduce transmit power by using the MCU in the radio frequency system.

10. The method according to claim 9, wherein the method further comprises:
    after the direction of the antenna array is adjusted, if a level value corresponding to the downlink signal received from the network-side device decreases, adjusting the direction of the antenna array in the radio frequency system.

* * * * *